(12) United States Patent
Ross et al.

(10) Patent No.: US 11,875,874 B2
(45) Date of Patent: Jan. 16, 2024

(54) DATA STRUCTURES WITH MULTIPLE READ PORTS

(71) Applicant: Groq, Inc., Mountain View, CA (US)

(72) Inventors: Jonathan Alexander Ross, Palo Alto, CA (US); Gregory M. Thorson, Palo Alto, CA (US)

(73) Assignee: Groq, Inc., Mountain View, CA (US)

( * ) Notice: Subject to any disclaimer, the term of this patent is extended or adjusted under 35 U.S.C. 154(b) by 0 days.

(21) Appl. No.: 17/397,158

(22) Filed: Aug. 9, 2021

(65) Prior Publication Data

US 2022/0101896 A1   Mar. 31, 2022

Related U.S. Application Data

(63) Continuation of application No. 16/132,196, filed on Sep. 14, 2018, now Pat. No. 11,114,138.

(Continued)

(51) Int. Cl.
*G11C 7/10* (2006.01)
*G06F 9/30* (2018.01)
(Continued)

(52) U.S. Cl.
CPC ........ *G11C 7/1075* (2013.01); *G06F 9/30029* (2013.01); *G06F 9/3887* (2013.01); *G11C 7/22* (2013.01)

(58) Field of Classification Search
None
See application file for complete search history.

(56) References Cited

U.S. PATENT DOCUMENTS 4,670,856 A   6/1987   Nishino et al.
5,058,001 A   10/1991  Li
(Continued)

FOREIGN PATENT DOCUMENTS

EP   0940012 B1   4/2002
EP   3 343 463 A1   7/2018
(Continued)

OTHER PUBLICATIONS

Taiwanese Intellectual Property Office, Office Action, TW Patent Application No. 108109969, dated Feb. 14, 2020, 12 pages (with concise explanation of relevance).
(Continued)

*Primary Examiner* — Stephanie Wu
(74) *Attorney, Agent, or Firm* — Amin, Turocy & Watson, LLP

(57) ABSTRACT

A memory structure having $2^m$ read ports allowing for concurrent access to n data entries can be constructed using three memory structures each having $2^{m-1}$ read ports. The three memory structures include two structures providing access to half of the n data entries, and a difference structure providing access to difference data between the halves of the n data entries. Each pair of the $2^m$ ports is connected to a respective port of each of the $2^{m-1}$-port data structures, such that each port of the part can access data entries of a first half of the n data entries either by accessing the structure storing that half directly, or by accessing both the difference structure and the structure containing the second half to reconstruct the data entries of the first half, thus allowing for a pair of ports to concurrently access any of the stored data entries in parallel.

19 Claims, 5 Drawing Sheets

Related U.S. Application Data

(60) Provisional application No. 62/559,390, filed on Sep. 15, 2017.

(51) Int. Cl.
  *G06F 9/38* (2018.01)
  *G11C 7/22* (2006.01)

(56) References Cited

U.S. PATENT DOCUMENTS

| | | | |
|---|---|---|---|
| 5,146,543 A | 9/1992 | Vassiliadis et al. | |
| 5,179,702 A | 1/1993 | Spix et al. | |
| 5,333,279 A | 7/1994 | Dunning | |
| 5,379,440 A | 1/1995 | Kelly et al. | |
| 5,488,729 A | 1/1996 | VeQesna et al. | |
| 5,541,914 A | 7/1996 | Krishnamoorthy et al. | |
| 5,590,083 A | 12/1996 | Pinkham et al. | |
| 5,594,915 A | 1/1997 | Atalla | |
| 5,794,062 A | 8/1998 | Baxter | |
| 5,796,745 A | 8/1998 | Adams et al. | |
| 5,842,034 A | 11/1998 | Bolstad et al. | |
| 5,889,413 A | 3/1999 | Bauer | |
| 5,898,881 A | 4/1999 | Miura et al. | |
| 5,958,041 A | 9/1999 | Petolino, Jr. et al. | |
| 6,181,164 B1 | 1/2001 | Miller | |
| 6,243,808 B1 | 6/2001 | Wang | |
| 6,279,057 B1 | 8/2001 | Westby | |
| 6,298,162 B1 | 10/2001 | Sutha et al. | |
| 6,681,316 B1 | 1/2004 | Clermidy et al. | |
| 6,712,313 B2 | 3/2004 | Zoppitelli et al. | |
| 6,988,181 B2 | 1/2006 | Saulsbury et al. | |
| 7,015,913 B1 | 3/2006 | Lindholm et al. | |
| 7,181,484 B2 | 2/2007 | Stribaek et al. | |
| 7,236,995 B2 | 6/2007 | Hinds | |
| 7,272,730 B1 | 9/2007 | Acquaviva et al. | |
| 7,339,941 B2 | 3/2008 | Twomey | |
| 7,421,559 B1 | 9/2008 | Yadav | |
| 7,640,528 B1 | 12/2009 | Baeckler | |
| 7,805,392 B1 | 9/2010 | Steele et al. | |
| 7,861,060 B1 | 12/2010 | Nickolls et al. | |
| 7,912,889 B1 | 3/2011 | Juffa et al. | |
| 7,965,725 B2 | 6/2011 | Langevin et al. | |
| 8,038,539 B2 | 10/2011 | Stamps et al. | |
| 8,089,959 B2 | 1/2012 | Szymanski | |
| 8,250,555 B1 | 8/2012 | Lee et al. | |
| 8,286,172 B2 | 10/2012 | Chakradhar et al. | |
| 8,345,540 B2 | 1/2013 | Rollins | |
| 8,370,280 B1 | 2/2013 | Lin et al. | |
| 8,407,167 B1 | 3/2013 | Abts et al. | |
| 8,583,895 B2 | 11/2013 | Jacobs et al. | |
| 8,655,937 B1 | 2/2014 | Vanderspek | |
| 8,689,202 B1 | 4/2014 | Braun et al. | |
| 8,830,993 B1 | 9/2014 | Dublin et al. | |
| 8,850,262 B2 | 9/2014 | Cardinell et al. | |
| 8,989,220 B2 | 3/2015 | Scrobohaci et al. | |
| 9,009,660 B1 | 4/2015 | Griffin et al. | |
| 9,146,747 B2 | 9/2015 | Moloney et al. | |
| 9,388,862 B2 | 7/2016 | Lidak | |
| 9,432,298 B1 | 8/2016 | Smith | |
| 9,442,757 B2 | 9/2016 | Munshi et al. | |
| 9,535,869 B2 | 1/2017 | Zheng | |
| 9,639,490 B2 | 5/2017 | Blankenship et al. | |
| 9,672,188 B2 | 6/2017 | Vorbach | |
| 9,690,938 B1 | 6/2017 | Saxe et al. | |
| 9,691,019 B1 | 6/2017 | Gulland et al. | |
| 9,697,463 B2 | 7/2017 | Ross et al. | |
| 9,710,265 B1 | 7/2017 | Temam et al. | |
| 9,710,748 B2 | 7/2017 | Ross et al. | |
| 9,723,317 B2 | 8/2017 | Hattori | |
| 9,805,303 B2 | 10/2017 | Ross et al. | |
| 10,167,800 B1 | 1/2019 | Chuna et al. | |
| 10,175,980 B2 | 1/2019 | Temam et al. | |
| 10,235,735 B2 | 3/2019 | Venkatesh et al. | |
| 10,320,390 B1 | 6/2019 | Ross | |
| 10,489,680 B2 | 11/2019 | Aliabadi et al. | |
| 10,521,488 B1 | 12/2019 | Ross et al. | |
| 10,754,621 B2 | 8/2020 | Thorson | |
| 10,776,110 B2 | 9/2020 | Pearce et al. | |
| 10,936,569 B1 | 3/2021 | Baskaran et al. | |
| 11,086,623 B2 | 8/2021 | Valentine et al. | |
| 2001/0051860 A1 | 12/2001 | Copeland et al. | |
| 2002/0060796 A1 | 5/2002 | Kanno et al. | |
| 2002/0103961 A1 | 8/2002 | Ayukawa et al. | |
| 2003/0095547 A1 | 5/2003 | Schofield | |
| 2003/0206527 A1 | 11/2003 | Yim | |
| 2004/0078555 A1 | 4/2004 | Porten et al. | |
| 2004/0150543 A1 | 8/2004 | Wang et al. | |
| 2004/0215679 A1 | 10/2004 | Beaumont | |
| 2005/0125594 A1 | 6/2005 | Mattausch et al. | |
| 2005/0278505 A1 | 12/2005 | Lim et al. | |
| 2006/0161338 A1 | 7/2006 | Sohn et al. | |
| 2006/0179207 A1 | 8/2006 | Eisen et al. | |
| 2006/0190519 A1 | 8/2006 | Stribaek et al. | |
| 2006/0225061 A1 | 10/2006 | Ludwig et al. | |
| 2007/0124732 A1 | 5/2007 | Lia et al. | |
| 2008/0126761 A1 | 5/2008 | Fontenot et al. | |
| 2008/0209181 A1 | 8/2008 | Petkov et al. | |
| 2008/0244135 A1 | 10/2008 | Akesson et al. | |
| 2008/0301354 A1 | 12/2008 | Bekooij | |
| 2009/0138534 A1 | 5/2009 | Lee et al. | |
| 2009/0150621 A1 | 6/2009 | Lee | |
| 2011/0022791 A1 | 1/2011 | Iyer et al. | |
| 2011/0173258 A1 | 7/2011 | Arimilli et al. | |
| 2011/0273459 A1 | 11/2011 | Letellier et al. | |
| 2011/0320698 A1* | 12/2011 | Wang | G06F 13/1663 711/149 |
| 2012/0072699 A1 | 3/2012 | Vorbach et al. | |
| 2012/0127818 A1 | 5/2012 | Levy et al. | |
| 2012/0159507 A1 | 6/2012 | Kwon et al. | |
| 2012/0240185 A1 | 9/2012 | Kapoor et al. | |
| 2012/0275545 A1 | 11/2012 | Utsunomiya et al. | |
| 2012/0303933 A1 | 11/2012 | Manet et al. | |
| 2012/0317065 A1 | 12/2012 | Bernstein et al. | |
| 2012/0331197 A1 | 12/2012 | Campbell et al. | |
| 2013/0010636 A1 | 1/2013 | Regula | |
| 2013/0070588 A1 | 3/2013 | Steele et al. | |
| 2013/0212277 A1 | 8/2013 | Bodik et al. | |
| 2014/0047211 A1 | 2/2014 | Fleischer et al. | |
| 2014/0115301 A1 | 4/2014 | Sanghai et al. | |
| 2014/0181171 A1 | 6/2014 | Dourbal | |
| 2014/0201755 A1 | 7/2014 | Munshi et al. | |
| 2014/0281284 A1 | 9/2014 | Block et al. | |
| 2015/0046678 A1 | 2/2015 | Moloney et al. | |
| 2015/0378639 A1 | 12/2015 | Chien et al. | |
| 2015/0379429 A1 | 12/2015 | Lee et al. | |
| 2016/0062947 A1 | 3/2016 | Chetlur et al. | |
| 2016/0246506 A1* | 8/2016 | Hebig | G06F 3/0629 |
| 2016/0328158 A1* | 11/2016 | Bromberg | G06F 3/0611 |
| 2016/0337484 A1 | 11/2016 | Tola | |
| 2016/0342892 A1 | 11/2016 | Ross | |
| 2016/0342893 A1 | 11/2016 | Ross et al. | |
| 2016/0371093 A1 | 12/2016 | Chang | |
| 2017/0032281 A1 | 2/2017 | Hsu | |
| 2017/0063609 A1 | 3/2017 | Philip et al. | |
| 2017/0085475 A1 | 3/2017 | Cheng et al. | |
| 2017/0103316 A1 | 4/2017 | Ross et al. | |
| 2017/0139677 A1 | 5/2017 | Lutz et al. | |
| 2017/0168990 A1 | 6/2017 | Kernert et al. | |
| 2017/0177352 A1 | 6/2017 | Quid-Ahmed-Vail | |
| 2017/0220719 A1 | 8/2017 | Elrabaa et al. | |
| 2017/0331881 A1 | 11/2017 | Chandramouli et al. | |
| 2017/0347109 A1 | 11/2017 | Hendry et al. | |
| 2017/0372202 A1 | 12/2017 | Ginsburg et al. | |
| 2018/0046903 A1 | 2/2018 | Yao et al. | |
| 2018/0046907 A1 | 2/2018 | Ross et al. | |
| 2018/0075338 A1 | 3/2018 | Gokmen | |
| 2018/0121196 A1 | 5/2018 | Temam et al. | |
| 2018/0121796 A1 | 5/2018 | Deisher et al. | |
| 2018/0145850 A1 | 5/2018 | Tam et al. | |
| 2018/0157966 A1 | 6/2018 | Henry et al. | |
| 2018/0191537 A1 | 7/2018 | Xiong et al. | |
| 2018/0198730 A1 | 7/2018 | Cook et al. | |
| 2018/0247190 A1 | 8/2018 | Chuna et al. | |
| 2018/0267932 A1* | 9/2018 | Zhu | G06F 9/3867 |

(56) References Cited

U.S. PATENT DOCUMENTS

| | | |
|---|---|---|
| 2018/0314671 A1 | 11/2018 | Zhang et al. |
| 2018/0315157 A1 | 11/2018 | Quid-Ahmed-Vail et al. |
| 2018/0329479 A1 | 11/2018 | Meixner |
| 2018/0357019 A1* | 12/2018 | Karr .................... G06F 11/2005 |
| 2019/0089619 A1 | 3/2019 | Yeager et al. |
| 2019/0206454 A1 | 7/2019 | Ross et al. |
| 2019/0244080 A1 | 8/2019 | Li et al. |
| 2019/0303147 A1 | 10/2019 | Brewer |
| 2019/0311243 A1 | 10/2019 | Whatmough et al. |
| 2019/0370645 A1 | 12/2019 | Lee et al. |
| 2020/0117993 A1 | 4/2020 | Martinez-Canales et al. |
| 2020/0192701 A1 | 6/2020 | Horowitz et al. |
| 2020/0285605 A1 | 9/2020 | Nam |

FOREIGN PATENT DOCUMENTS

| | | |
|---|---|---|
| JP | 2017-062781 A | 3/2017 |
| TW | 200926033 A | 6/2009 |
| TW | 201706871 A | 2/2017 |
| TW | 201706917 A | 2/2017 |
| TW | 201732560 A | 9/2017 |
| TW | 201804320 A | 2/2018 |
| TW | 201810538 A | 3/2018 |
| WO | 2016/186826 A1 | 11/2016 |

OTHER PUBLICATIONS

PCT International Search Report and Written Opinion. PCT Application No. PCT/US2019/022357, dated Nov. 7, 2019, 11 pages.
United States Office Action, U.S. Appl. No. 16/132,196, dated Dec. 8, 2020, 13 pages.
United States Office Action, U.S. Appl. No. 16/132,196, filed May 20, 2020, 22 pages.
United States Office Action, U.S. Appl. No. 16/132,196, filed Dec. 11, 2019, 20 pages.
Non Final Office Action received for U.S. Appl. No. 16/132,243 dated Dec. 31, 2019, 28 bages.
Notice of Allowance received for U.S. Appl. No. 16/132,243 dated Jun. 22, 2021, 47 pages.
Notice of Allowance received for U.S. Appl. No. 16/132,243 dated Sep. 30, 2021, 42 pages.
Notice of Allowance received for U.S. Appl. No. 16/132,243 dated Dec. 15, 2021, 19 pages.
Notice of Allowance received for U.S. Appl. No. 16/526,966 dated Feb. 8, 2021, 45 pages.
Notice of Allowance received for U.S. Appl. No. 16/526,966 dated Jun. 21, 2021, 28 pages.
Notice of Allowance received for U.S. Appl. No. 16/526,966 dated Oct. 15, 2021, 30 pages.
Notice of Allowance received for U.S. Appl. No. 16/526,966 dated Jan. 5, 2022, 18 pages.
Communication Pursuant to Article 94(3) EPC received for European Patent Application Serial No. 19827878.0 dated May 22, 2023, 5 pages.
Decision to Grant received for Japanese Patent Application Serial No. 2021-527941 dated Mar. 28, 2023, 5 pages (Including English Translation).
Written Decision on Registration received for Korean Patent Application Serial No. KR20217012323 dated Apr. 24, 2023, 12 pages (Including English Translation).
Wikipedia, "Reduced instruction set computer," Last edited Jan. 14, 2021, pp. 1-10, [Online] [Retrieved Jan. 20, 2021] Retrieved from the Internet <URL: https://en.wikipedia.ora/wiki/Reduced_instruction_set_computer>.
Wikipedia, "SIMD," Last edited Dec. 18, 2020, pp. 1-10, [Online] [Retrieved Jan. 22, 2021] Retrieved from the Internet <URL: https://en.wikipedia.org/wiki/SIMD>.
Wikipedia, "Tensor," Last edited Jan. 10, 2021, pp. 1-20, [Online] [Retrieved Jan. 15, 2021] Retrieved from the Internet <URL: https://en.wikipedia.org/wiki/Tensor>.
Yang et al., "Fast subword permutation instructions based on butterfly network," Proceedings of SPIE, Media Processor 2000, Jan. 27-28, 2000, pp. 80-86.
Office Action received for Taiwan Patent Application Serial No. 108131334 dated Jun. 30, 2022, 6 pages (Including English Translation).
Final Office Action received for U.S. Appl. No. 16/951,938 dated Feb. 4, 2022, 23 pages.
Non Final Office Action received for U.S. Appl. No. 16/951,938 dated Aug. 17, 2021, 32 pages.
Non Final Office Action received for U.S. Appl. No. 16/932,632 dated May 19, 2021, 24 pages.
Non Final Office Action received for U.S. Appl. No. 16/928,958 dated Sep. 21, 2021, 19 pages.
Non Final Office Action received for U.S. Appl. No. 16/928,958 dated Jul. 23, 2021, 19 pages.
Final Office Action received for U.S. Appl. No. 16/928,958 dated Jun. 4, 2021, 18 pages.
Non Final Office Action received for U.S. Appl. No. 16/928,958 dated Apr. 12, 2021, 27 pages.
Non Final Office Action received for U.S. Appl. No. 16/526,936 dated Jul. 1, 2022, 27 pages.
Non Final Office Action received for U.S. Appl. No. 16/277,817 dated May 20, 2020, 37 pages.
Final Office Action received for U.S. Appl. No. 16/243,768 dated Apr. 26, 2021, 26 pages.
Non Final Office Action received for U.S. Appl. No. 16/243,768 dated Sep. 1, 2020, 22 pages.
Non Final Office Action received for U.S. Appl. No. 17/528,609 dated Jan. 4, 2023, 26 pages.
Non Final Office Action received for U.S. Appl. No. 17/532,694 dated Jan. 19, 2023, 27 oaaes.
Groq, Inc. "The Challenge of Batch Size 1: Groq Adds Responsiveness to Inference Performance" White Paper, Apr. 2020, pp. 1-7.
Office Action received for Indian Patent Application Serial No. 202247031762 dated Sep. 20, 2022, 6 pages.
Lethin, R.A. et al., "How VLIW Almost Disappeared—and Then Proliferated," IEEE Solid-State Circuits Magazine, vol. 1, No. 3, Aug. 7, 2009, pp. 15-23.
Mercaldi et al. "Instruction Scheduling for a Tiled Dataflow Architecture," ACM SIGARCH Computer Architecture News, vol. 34, No. 5, Oct. 20, 2006, pp. 141-150.
Sotiropoulos, A. et al. "Enhancing the Performance of Tiled Loop Execution onto Clusters Using Memory Mapped Network Interfaces and Pipelined Schedules," ipdps, Apr. 15, 2002, pp. 1-9.
Southard, D. "Tensor Streaming Architecture Delivers Unmatched Performance for Compute-Intensive Workloads" Groq White Paper, Nov. 18, 2019, pp. 1-7.
Non Final Office Action received for U.S. Appl. No. 17/684,337 dated Feb. 14, 2023, 45 pages.
Non Final Office Action received for U.S. Appl. No. 17/104,465 dated Nov. 12, 2021, 40 pages.
Notice of Allowance received for U.S. Appl. No. 16/132,196 dated Apr. 30, 2021, 35 pages.
Notice of Allowance received for U.S. Appl. No. 16/243,768 dated May 21, 2021, 30 pages.
Non Final Office Action received for U.S. Appl. No. 17/582,895 dated Apr. 6, 2023, 32 pages.
Notice of Allowance received for U.S. Appl. No. 16/951,938 dated Dec. 23, 2022, 33 pages.
Notice of Allowance received for U.S. Appl. No. 16/132,102 dated Jul. 1, 2021, 26 pages.
Notice of Allowance received for U.S. Appl. No. 16/526,916 dated Sep. 20, 2021, 28 pages.
Notice of Allowance received for U.S. Appl. No. 16/526,922 dated Aug. 27, 2021, 25 pages.
Notice of Allowance received for U.S. Appl. No. 16/526,936 dated Oct. 13, 2022, 23 pages.
Notice of Allowance received for U.S. Appl. No. 17/528,609 dated Jan. 30, 2023, 27 pages.
Non Final Office Action received for U.S. Appl. No. 16/117,763 dated Oct. 24, 2019, 17 pages.

(56) References Cited

OTHER PUBLICATIONS

Notice of Allowance received for U.S. Appl. No. 17/532,694 dated Feb. 10, 2023, 27 pages.
Notice of Allowance received for U.S. Appl. No. 16/932,632 dated Sep. 9, 2021, 25 pages.
Notice of Allowance received for U.S. Appl. No. 16/277,817 dated Sep. 30, 2020, 34 pages.
Notice of Allowance received for U.S. Appl. No. 16/928,958 dated Dec. 17, 2021, 16 pages.
Notice of Allowance received for U.S. Appl. No. 16/117,763 dated Apr. 14, 2020, 17 pages.
Notice of Allowance received for U.S. Appl. No. 16/117,763 dated Jun. 8, 2020, 5 pages.
Notice of Intent to Grant for European Patent Application Serial No. 19765954.3 dated Feb. 17, 2023, 74 pages.
Notice of Intent to Grant for European Patent Application No. 19765954.3 dated Oct. 17, 2022, 41 pages.
Communication Pursuant to Article 94(3) EPC received for European Patent Application Serial No. 19765954.3 dated Feb. 23, 2022, 8 pages.
Notice of Allowance received for U.S. Appl. No. 17/105,976, filed Feb. 3, 2022, 28 pages.
Notice of Allowance received for U.S. Appl. No. 17/684,337, filed Apr. 13, 2023, 50 pages.
Sotiropoulos et al., Enhancing the Performance of Tiled Loop Execution on to Clusters using Memory Mapped NetworkInterfaces and Pipelined Schedules, 2002, citation 1 page.
Notice of Allowance received for U.S. Appl. No. 17/697,201 dated Feb. 23, 2023, 37 pages.
Notice of Allowance received for U.S. Appl. No. 17/697,201 dated Mar. 7, 2023, 4 pages.
International Search Report and Written Opinion received for International PCT Application Serial No. PCT/US2019/062303 dated Mar. 25, 2020, 14 pages.
Non Final Office Action received for U.S. Appl. No. 16/686,864 dated Jun. 1, 2021, 22 pages.
Non Final Office Action received for U.S. Appl. No. 16/686,866 dated Sep. 23, 2021, 25 pages.
Non Final Office Action received for U.S. Appl. No. 16/686,858 dated Jan. 25, 2022, 32 pages.
Non Final Office Action received for U.S. Appl. No. 17/519,425 dated Jan. 26, 2023, 17 pages.
Bustamam et al. "Fast Parallel Markov Clustering in Bioinformatics Using Massively Parallel Computing on GPU with CUDA And ELLPACK-R Sparse Format," IEEE/ACM Transactions on Computational Biology and Bioinformatics, vol. 9, No. 3, Mar. 22, 2012, pp. 679-692.
Bouaziz et al., "Parallel Long Short-Term Memory for Multi-Stream Classification," IEEE Spoken Language Technology Workshop, Dec. 13-16, 2016, pp. 218-223.
Fuchs et al., "Parallel Vectors Criteria for Unsteady Flow Vortices," IEEE Transactions on Visualization and Computer Graphics, vol. 14, No. 3, May-Jun. 2008, pp. 615-626.
Gelder et al., "Using PVsolve to Analyze and Locate Positions of Parallel Vectors," IEEE Transactions on Visualization and Computer Graphics, vol. 15, No. 4, Jul.-Aug. 2009, pp. 682-695.
Gil-Cacho et al., "Nonlinear Acoustic Echo Cancellation Based On A Parallel-Cascade Kernel Affine Projection Algorithm," IEEE International Conference on Acoustics, Speech and Signal Processing, Mar. 25-30, 2012, pp. 33-36.
Japan Patent Office, Office Action, Japanese Patent Application No. 2021-527941 dated Dec. 20, 2022, 11 pages (Including English Translation).
Request for the Submission of an Opinion received for Korean Patent Application Serial No. 10-2021-7012323 dated Aug. 29, 2022, 10 pages.
Rodrigues et al., "SIMDization of Small Tensor Multiplication Kernels for Wide SIMD Vector Processors," 4th Workshop on Programming Models for SIMDNector Processing, Feb. 2018, pp. 1-8.
Suh et al., "A Performance Analysis of PIM, Stream Processing, and Tiled Processing on Memory-Intensive Signal Processing Kernels," 30th Annual International Symposium on Computer Architecture, Jun. 2003, pp. 410-421.
Office Action received for Taiwan Patent Application Serial No. 108142039 dated Jan. 3, 2023, 28 pages.
Non Final Office Action received for U.S. Appl. No. 16/686,870 dated May 27, 2022, 61 pages.
Final Office Action received for U.S. Appl. No. 16/686,858 dated Jun. 29, 2022, 23 pages.
Notice of Allowance received for U.S. Appl. No. 17/519,425 dated Mar. 15, 2023, 25 pages.
Notice of Allowance received for U.S. Appl. No. 16/686,858 dated Aug. 3, 2022, 25 pages.
Notice of Allowance received for U.S. Appl. No. 16/686,864 dated Jul. 29, 2021, 14 pages.
Notice of Allowance received for U.S. Appl. No. 16/686,866 dated Dec. 7, 2021, 13 pages.
Notice of Allowance received for U.S. Appl. No. 16/686,870 dated Aug. 17, 2022, 54 pages.
Notice of Allowance received for U.S. Appl. No. 16/686,870 dated Aug. 24, 2022, 5 pages.
Notice of Allowance received for U.S. Appl. No. 16/686,870 dated Oct. 25, 2022, 5 pages.
Non Final Office Action received for U.S. Appl. No. 17/203,214 dated Mar. 15, 2023, 52 pages.
Dey et al., "Fast Integer Multiplication Using Modular Arithmetic", The proceedings of the 40th ACM Symposium on Theory of Computing, 2008, 7 pages.
Lopes et al., "A fused hybrid floating point and fixed point dot-ptoduct for FPGAs", International symposium on Applied reconfigurable computing, ARC 2010, pp. 157-168.
Haidar et al., "Harnessing GPU Tensor Cores for Fast FP16 Arithmetic to Speed up Mixed-Precision Iterative Refinement Solvers", SC18, Nov. 11-16, 2018, Dallas, USA, 12 pages.
Abts et al., "Think Fast: A Tensor Streaming Processor (TSP) for Accelerating Deep Learning Workloads," 2020 ACM/IEEE 47th Annual International Symposium on Computer Architecture, May 2020, pp. 145-158.
Chang, W. "Computer Organization," CSC137, Sacramento State University, Spring Semester 2020, pp. 1-70.
De et al.' "Fast Integer Multiplication Using Modular Arithmetic," SIAM Journal on Computing, vol. 42, No. 2, Apr. 18, 2013, pp. 1-18.
Groq, "Grog Announces World's First Architecture Capable of 1,000,000,000,000,000 Operations per Second on a Single Chip," Nov. 14, 2019, 3 pages, [Online] [Retrieved on Jan. 12, 2021] Retrieved from the Internet <URL: https://www.prnewswire.com/news-releases/grog-announces-worlds-firstarchitecture-capable-of-1-000-000-000-000-000-operations-per-second-on-a-single-chip-300958743.html>.
Hu et al., "On-Chip Instruction Generation for Cross-Layer CNN Accelerator on FPGA," 2019 IEEE Computer Society Annual Symposium on VLSI (ISVLSI), Jul. 2019, pp. 7-12.
Johnson, J. "Making floating point math highly efficient for AI hardware," Nov. 8, 2018, 9 pages, [Online] [Retrieved on Jan. 20, 2021] Retrieved from the Internet <URL: https://engineering.fb.com/2018/11/08/ai-research/floating-point-math/>.
Jouppi et al., "In-Datacenter Performance Analysis of a Tensor Processing Unit," ISCA '17, Jun. 2017, pp. 1-12.
Narksith et al., "Switch adjusting on hierarchical shuffle-exchange networks for all-to-all personalized exchange," The 2013 10th International Joint Conference on Computer Science and Software Engineering, May 29-31, 2013, pp. 121-126.
International Search Report and Written Opinion received for PCT Application Serial No. PCT/US20/62241 dated Feb. 11, 2021, 7 pages.
International Search Report and Written Opinion received for PCT Application Serial No. PCT/US2019/048568 dated Nov. 20, 2019, 10 pages.
International Search Report and Written Opinion received for PCT Application Serial No. PCT/US2019/068767 dated Mar. 17, 2020, 10 pages.

(56) References Cited

OTHER PUBLICATIONS

Ren et al., "Permutation Capability of Optical Cantor Network", IEEE, Dec. 2007, pp. 398-403.
Final Office Action received for U.S. Appl. No. 16/132,243 dated Aug. 10, 2020, 32 pages.
Non Final Office Action received for U.S. Appl. No. 16/132,243 dated Dec. 31, 2019, 18 pages.
Non Final Office Action received for U.S. Appl. No. 17/105,976, filed Sep. 30, 2021, 37 pages.
Waksman, A. "A Permutation Network," Journal of the Association for Computing Machinery, vol. 15, No. 1, Jan. 1968, pp. 159-163.
Wang et al., "Hera: A Reconfigurable and Mixed-Mode Parallel Computing Engine on Platform FPGAS" Department of Electrical and Computer Engineering, Jan. 2004, pp. 1-6.
Wikipedia, "Complex instruction set computer," Last edited Dec. 27, 2020, pp. 1-4, [Online] [Retrieved Jan. 20, 2021] Retrieved from the Internet <URL: https://en.wikipedia.org/wiki/Complex instruction set computer>.
Wikipedia, "Harvard architecture," Last edited Mar. 4, 2020, pp. 1-4, [Online] [Retrieved Jan. 20, 2021] Retrieved from the Internet <URL: https://en.wikipedia.org/wiki/Harvard architecture>.
Wikipedia, "Instruction pipelining," Last edited Jan. 14, 2021, pp. 1-8, [Online] [Retrieved Jan. 8, 2021] Retrieved from the Internet <URL: https://en.wikipedia.org/wiki/Instruction pipelining>.
Wikipedia, "Parallel computing," Last edited Jan. 16, 2021, pp. 1-21, [Online] [Retrieved Jan. 22, 2021] Retrieved from the Internet <URL: https://en.wikipedia.org/wiki/Parallel_computing>.
Notice of Allowance received for U.S. Appl. No. 17/203,214 dated Jul. 19, 2023, 50 pages.
Non- Final office action received for U.S. Appl. No. 18/083,388 dated Jul. 14, 2023, 50 pages.
Notice of Allowance received for U.S. Appl. No. 17/684,337 dated Jul. 3, 2023, 91 pages.
Notice of Allowance received for U.S. Appl. No. 17/519,425 dated Jun. 20, 2023, 60 pages.
Notice of Allowance received for U.S. Appl. No. 17/397,158 dated Aug. 23, 2023, 78 pages.
Notice of Allowance received for U.S. Appl. No. 16/951,938 dated Sep. 5, 2023, 81 pages.
Notice of Allowance received for U.S. Appl. No. 18/083,388 dated Aug. 31, 2023, 25 pages.
Notice of Allowance received for U.S. Appl. No. 17/582,895 dated Aug. 16, 2023, 40 pages.
Decision to Grant a Patent received for European Patent Application Serial No. 19765954.3 dated Jun. 29, 2023, 2 pages.
Office Action received for Taiwan Patent Application Serial No. 11220743060 dated Aug. 1, 2023, 4 pages.
Office Action received for Chinese Patent Application Serial No. 201880006508.9 dated Jul. 19, 2023, 7 pages.
Notice of Allowance received for U.S. Appl. No. 17/203,214 dated Aug. 16, 2023, 5 pages.
Notice of Allowance received for U.S. Appl. No. 17/582,895 dated Oct. 4, 2023, 12 pages.
Notice of Allowance received for U.S. Appl. No. 16/951,938 dated Sep. 27, 2023, 102 pages.
Notice of Allowance received for U.S. Appl. No. 18/083,388 dated Oct. 4, 2023, 10 pages.
First Office Action received for Chinese Patent Application Serial No. 201980074328.9 dated Aug. 14, 2023, 6 pages (Including English Translation).

* cited by examiner

DATA STRUCTURES WITH MULTIPLE READ PORTS

CROSS-REFERENCE TO RELATED APPLICATIONS

This application is a continuation of U.S. application Ser. No. 16/132,196 filed on Sep. 14, 2018, which claims a benefit, and priority, under 35 U.S.C. § 119(e) to U.S. Provisional Patent Application Ser. No. 62/559,390, titled "Data Structures with Multiple Read Ports," filed on Sep. 15, 2017, which is hereby incorporated by reference in its entirety.

BACKGROUND

The present disclosure generally relates to storage of data structures, and specifically relates to storage of data structures having multiple read ports.

Data structures, such as look-up tables, may be used in many applications to perform a function on received input data. For example, an arithmetic logic unit (ALU) may perform an operation on a received input value by looking up the value in a look-up table and returning a corresponding output value.

In some cases, such as in single instruction multiple data (SIMD) applications, it may be desirable to be able to perform the same operation on different sets of input data in parallel. As such, multiple ALUs or other circuits may need to be able to access the data contained within the look up table in parallel.

SUMMARY

A memory structure having multiple read ports may be used to allow for parallel access by multiple ALUs or other processing devices to a common data structure, such as a look-up table. The memory structure may be constructed using a plurality of memory structures having fewer read ports.

A memory structure having $2^m$ read ports allowing for concurrent access to n data entries can be constructed using three memory structures (e.g., sub-structures) each having $2^{m-1}$ read ports. The three memory structures include a first structure providing access to a first half of the n data entries (n/2 entries), a second structure providing access to a second half of the n data entries (n/2 entries), and a difference structure providing access to difference data between the first and second halves of the n data entries (n/2 entries). Each of the $2^m$ ports may be connected to a respective port of each of the $2^{m-1}$-port data structures, such that a port may access data from the first half of the n data entries by accessing the first structure or by accessing both the difference structure and the second structure to reconstruct the data stored by the first structure. Similarly, a port may access data from the second half of the n data entries by accessing the second structure or by accessing both the difference structure and the first structure to reconstruct the data stored by the second structure.

As such, a 2-port memory structure for accessing n data entries can be constructed using three 1-port memory structure, each storing n/2 data entries. Similarly, a $2^m$-port memory structure for accessing n data entries can be constructed using multiple 1-port memory structures, storing a total of $(3/2)^m * n$ entries.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

A data structure such as a look-up table may be used by an arithmetic logic unit (ALU) or other circuit to perform an operation on received input data. In many parallel processing applications, such as single instruction multiple data (SIMD) applications, multiple ALUs may need to access the data structure in parallel. As such, it is desirable for the data structure to be implemented on a memory structure (e.g., a random access memory (RAM) or read only memory (ROM)) having multiple read ports. In addition, although the present disclosure refers primarily to ALUs as reading data from the data structure via one or more read ports, in other embodiments, any other type of circuit or consumer may read data from the data structure via one or more read ports.

Figure 1:
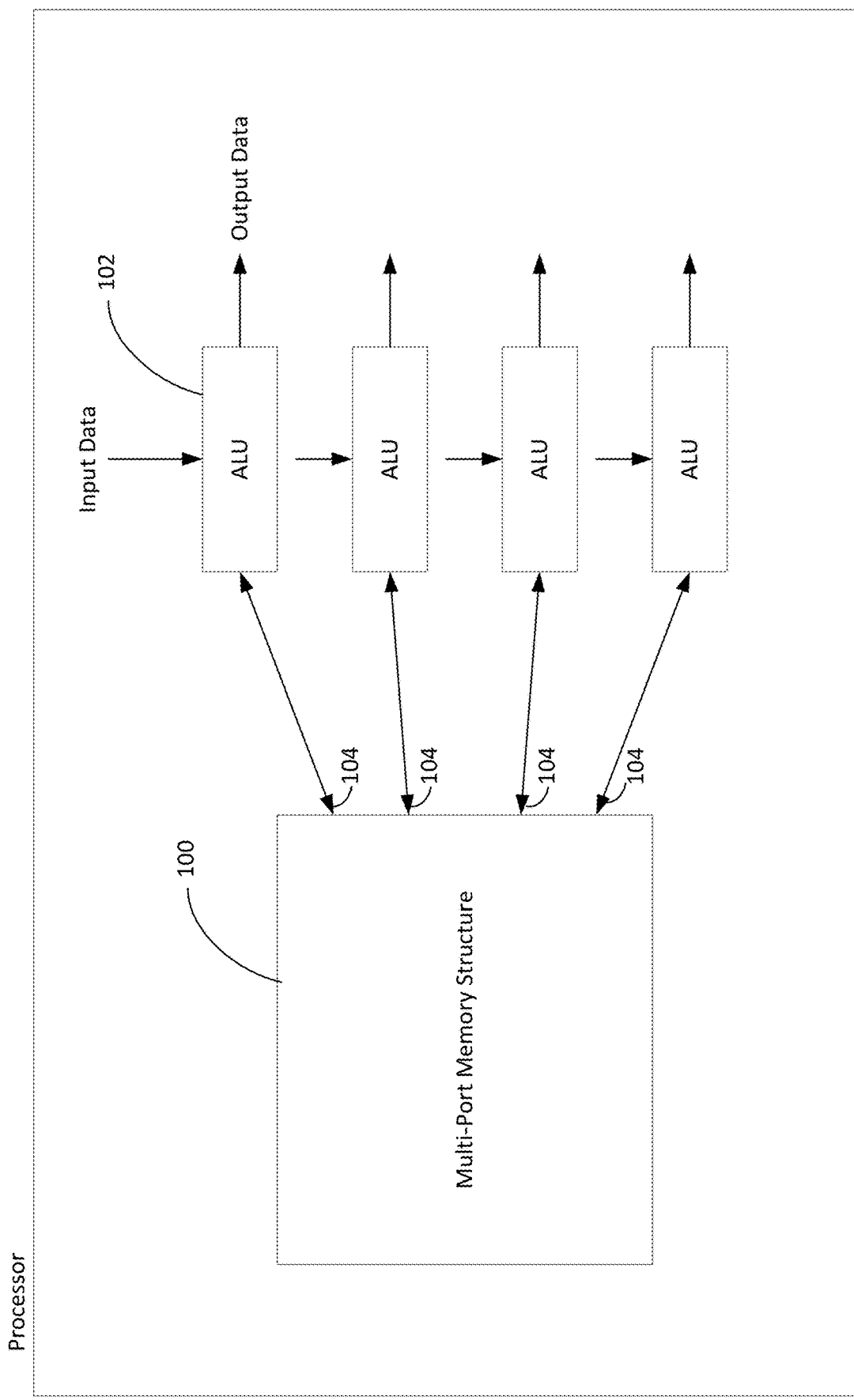
FIG. 1 illustrates a block diagram of a processor with a memory structure having multiple read ports, in accordance with some embodiments.

FIG. 1 illustrates a block diagram of a processor including a memory structure having multiple read ports, in accordance with some embodiments. The processor can be an integrated circuit (IC) device. In some embodiments the processor is a specialized processor for tensor processing. The processor includes a multi-port memory structure 100 and multiple ALUs 102. The multi-port memory structure 100 includes dynamic random access memory (DRAM) cells or other type of memory that store a data structure (e.g., a look-up table) that is accessed by a plurality of the ALUs 102. In some embodiments, the data structure is associated with a function, and maps function input values to function output values. For example, the data structure implements an activation function for a machine learned model, such as a rectified linear unit (RELU) function, binary step function, arc tan function, or other function.

The ALUs 102 may be part of a SIMD or other parallel processor, where each ALU 102 is configured to perform the same arithmetic operation on different sets of input data. For example, each ALU 102 receives a respective set of input data, and performs one or more look-ups on the data structure stored in the memory structure 100 to produce a respective set of output data based upon the function associated with the data structure. In order for the ALUs 102 to operate in parallel, the plurality of ALUs 102 may need to be able to concurrently access the data structure on the memory structure 100. For example, FIG. 1 illustrates the memory structure 100 having four read ports 104, each connected to one of four different ALUs 102. In one embodiment, each read port has its own dedicated address bus and its own dedicated data bus. The ALU reads data via a read port by providing an address to the address bus, and the memory structure 100 returns data from the data structure located at that address. As used herein, "concurrently" may refer to during a common time period (e.g., a clock cycle). For example, each of the plurality of ALUs may transmit a read request to the memory structure 100 during a particular clock cycle, in which the transmitted read requests may be considered to be concurrent to each other.

Figure 2:
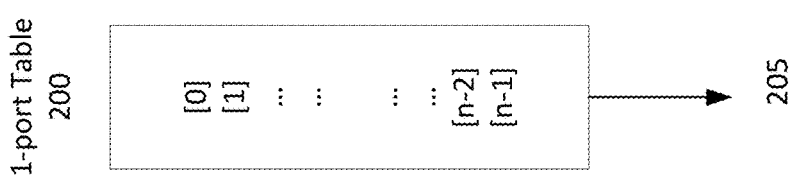
FIG. 2 illustrates a memory structure having a single read port, in accordance with some embodiments.

In some embodiments, a memory structure having multiple read ports, such as the memory structure 100, may be constructed using memory structures having fewer read ports. For example, the memory structure 100 may be constructed from a plurality of memory structures, each having a single read port. FIG. 2 illustrates a memory structure having a single read port, in accordance with some embodiments. The memory structure 200 stores a plurality of data entries (e.g., entries [0] through [n−1], where n comprises an integer value of 2 or greater). Because the memory structure 200 only has a single read port 205, only a single ALU may access the data contained by the memory structure 200 at a time.

An example way to allow for multiple ALUs to access any of the data of the structure 200 in parallel is to duplicate the data (e.g., entries [0] through [n−1]) across multiple single read port memory structures. For example, duplicating the data of the structure 200 across a second single read port memory structure may be done to construct a combined memory structure with two read ports, each of which can be independently accessed by a different ALU, providing access of any of the data in the original structure. However, this configuration also doubles the amount of memory needed to store the data, as each of the entries [0] through [n−1] will be duplicated across both single port memory structures. Using this type of configuration, in order to build a memory structure having n entries accessible over $2^m$ read ports, a total of $n*2^m$ entries will need to be stored, where m comprises a positive integer value.

2-Port Memory Structure

Figure 3:
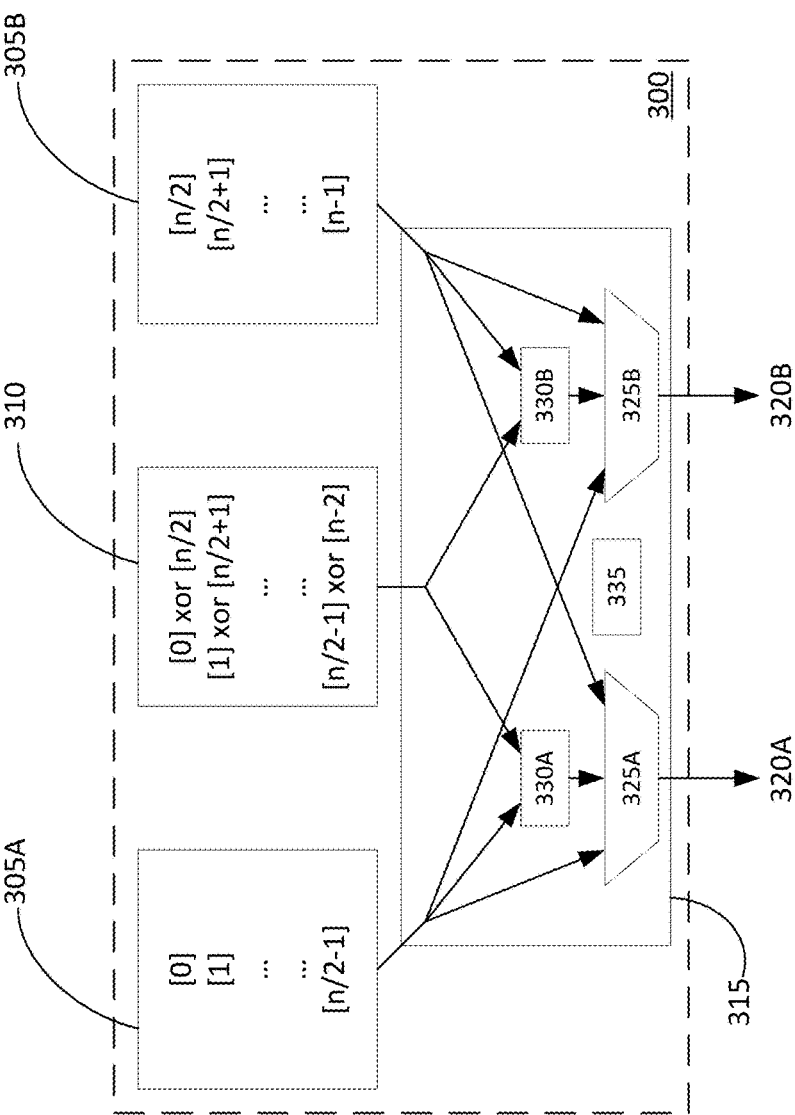
FIG. 3 illustrates a memory structure having two read ports, in accordance with some embodiments.

FIG. 3 illustrates a memory structure having two read ports, in accordance with some embodiments. As illustrated in FIG. 3, a 2-port memory structure 300 allowing for parallel access of any of n entries of data (entries [0] through [n−1]) is built from three 1-port memory structures. Each of the 1-port memory structure contains a table or other data structure storing half of the number data entries of the original data structure (e.g., n/2 entries). As such, the 2-port memory structure 300 will only require storage of 50% more entries in comparison to the original 1-port memory structure (e.g., the 1-port structure 200 illustrated in FIG. 2) while still allowing concurrent access to all n entries through either of the two read ports.

The 2-port memory structure 300 comprises a first 1-port memory structure 305A storing a table containing a first half of the data entries [0] through [n−1], and a second 1-port memory structure 305B storing a table containing a second half of the entries [0] through [n−1]. For ease of explanation, the first half of the data entries may also be referred to as the "lower" half (e.g., entries [0] through [n/2−1]), while the second half may also be referred to as the "upper" half (e.g., entries [n/2] through [n−1]). As such, the first structure 305A may be referred to as the "lower structure", while the second structure 305B may be referred to as the "upper structure."

In addition to the lower and upper structures 305A and 305B, the 2-port structure 300 further comprises a third 1-port structure 310 (hereinafter referred to as the "difference structure") storing n/2 entries, each indicating whether differences exist between a corresponding entry of the lower structure and a corresponding entry of the upper structure. For example, the difference structure may store entries indicating differences between entry [0] of the lower structure and entry [n/2] of the upper structure, between entries [1] and [n/2+1], and so forth. The difference may be determined using any function that allows for the value of a data entry of the lower or upper half to be determined using only the value of the corresponding difference and data entry of the opposite half. For example, in some embodiments, the entries in the difference structure are generated from an exclusive-or (XOR) of corresponding entries of the lower and upper structures. As such, the value of a particular data entry of the lower half can be determined using the corresponding upper half data entry and XOR value, without needing to access the lower structure. In other embodiments, reversible functions other than XOR can be used to calculate the difference entries.

The access circuit 315 comprises a circuit that maps the read ports of the lower structure 305A, upper structure 305B, and difference structure 310 to the two different read ports 320A and 320B (which may be referred to as the lower and upper read ports, respectively). Each of the read ports 320 is configured to receive read requests specifying read addresses of one or more entries to be read. The access circuit 315 comprises, for each of the read ports 320, a multiplexer (MUX) 325 and a difference calculation circuit 330. Each difference calculation circuit 330 is configured to receive data of corresponding entries from the difference structure 310 and one of the lower or upper structures 305A/B, to calculate the value of a corresponding entry from the remaining upper or lower structure 305B/A, such as by implementing an XOR operation or other reversible function. For example, any entry in the upper structure 305B (e.g., entry [n/2]) can be determined from an XOR of the corresponding entries of the lower structure 305A and the difference structure 310 (e.g., entry [0] and entry([0] XOR [n/2])). As such, a particular read port may provide data corresponding to entries of the upper structure 305B, even if the upper structure 305B is unavailable (e.g., due to being accessed by the other read port), by combining data retrieved from the lower structure 305A and the difference structure 310. Similarly, data entries of the lower structure 305A can be determined by accessing the upper structure 305B and the difference structure 310, when the lower structure 305A is unavailable.

In some embodiments, the difference circuits 330 comprise a first difference circuit 330A configured to determine entry values for the upper structure 305B using the lower structure 305A and the difference structure 310, and a second difference circuit 330B configured to determine entry values for the lower structure 305A using the upper structure 305B and the difference structure 310. The first and second difference circuits 330A/B may be referred to as the lower and upper difference circuits respectively.

The MUXes 325 comprise a lower MUX 325A and an upper MUX 325B, each configured to select between the lower structure 305A (for when the read request requests an address from the lower half of the stored entries), the upper structure 305A (for when the read request requests an address from the upper half of the stored entries), and the output of one of the difference circuits 330A or 330B, and provide the selected output to a respective read port 320A/B. For example, the lower read ports 320A receives an output of the lower MUX 325A, which is connected to the difference circuit 330A, while the upper read port 320B receives an output of the upper MUX 325B, which is connected to the difference circuit 330B.

In some embodiments, a conflict control circuit 335 uses a priority scheme to determine how each of the read ports 320A and 320B are able to access the data entries stored by the structures 305A, 305B, and 310. The conflict control circuit 335 is configured to receive addresses from the read ports corresponding to received read requests, and performs conflict resolution between the any concurrently received requests by controlling the MUXes 325A/B to select from which structure each read port 320A/B should receive data from.

For example, as discussed above, the read ports 320 may be designated as a lower read port 320A and an upper read port 320B. The lower read port 320A has "priority" to the lower structure 305A. As such, the conflict control circuit 335 configures the MUX 325A such that all requests through the lower read port 320A for entries in the lower structure 305A are read directly from the lower structure 305A. Similarly, the upper read port 320B has "priority" to the upper structure 305B, such that all requests through the upper read port 320B for entries in the upper structure 305B are read directly from the upper structure 305B. In addition, the conflict control circuit 335 may configure the MUXes 325A/B such that each read port 320A/B may read directly from lower/upper structure 305A/B to which it does not have priority whenever the other read port has not received a concurrent read request to read data from the same structure. However, if both the lower read port 320A and upper read port 320B receive concurrent requests to read one or more entries from the upper structure 305B, then the conflict control circuit 335 configures the MUX 325A such that the lower read port 320A reads from the output of the difference calculation circuit 330A instead, which determines the values of the requested entries of the upper structure 305B using the corresponding entries of the lower structure 305A and the difference structure 310. Similarly, if the lower and upper read ports 320A and 320B receive concurrent requests to read one or more entries from the lower structure 305A, the conflict control circuit 335 configures the MUX 325B to cause the upper read port 320B to read from the output of the difference calculation circuit 330B.

Although FIG. 3 illustrates a particular access circuit configuration, it is understood that in other embodiments, other access circuit configurations may be possible. For example, in some embodiments, either read port 320A or 320B may be able to read data entries of the lower or upper structures using the opposite structure and the difference structure. In some embodiments, an access circuit may be configured to map a plurality of memory structures to more than two ports.

$2^m$-Port Memory Structure

Figure 4:
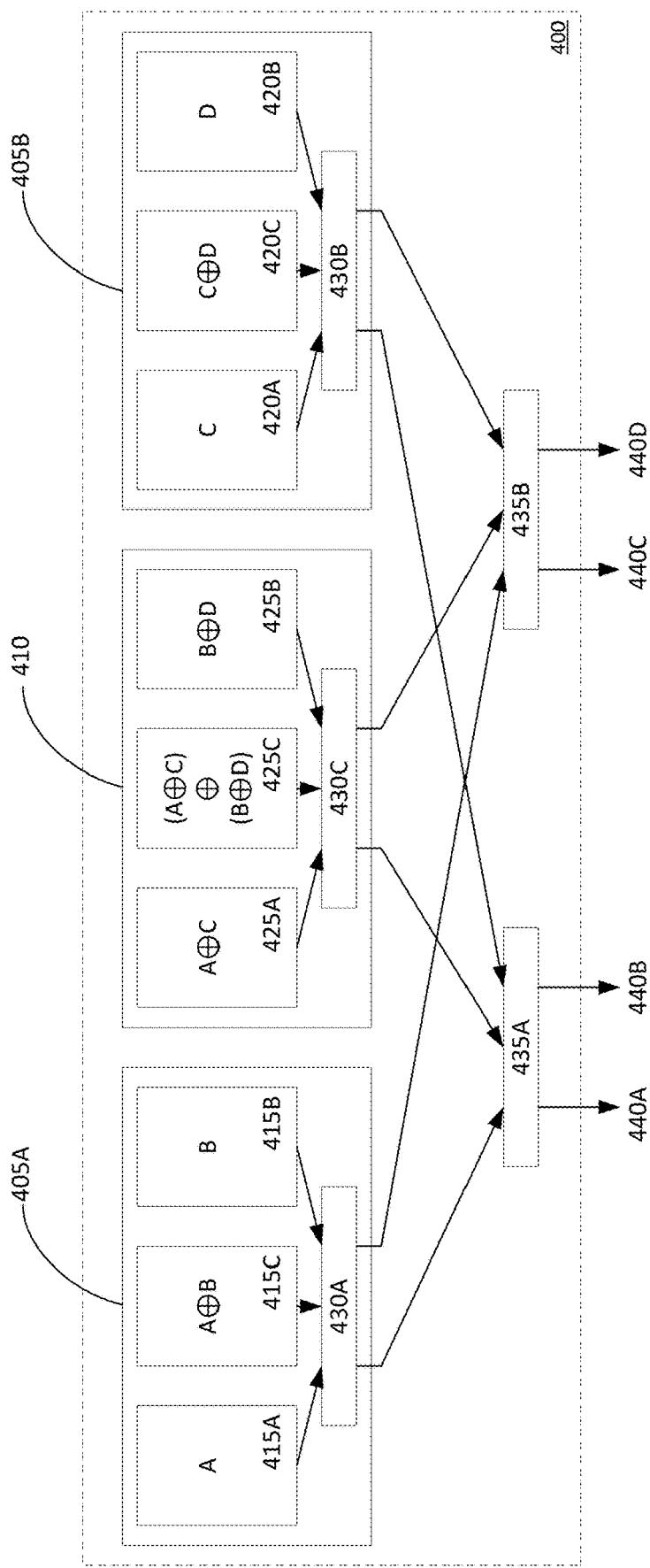
FIG. 4 illustrates a diagram of a 4-port structure that may be assembled using three different 2-port structures, in accordance with some embodiments.

The construction of 2-port memory structures using 1-port memory structures discussed above may be extrapolated to assemble structures with additional numbers of available read ports (e.g., $2^m$ read ports). FIG. 4 illustrates a diagram of a 4-port memory structure that may be assembled using three different 2-port memory structures, in accordance with some embodiments. The 4-port memory structure 400 is constructed from three 2-port memory structures, including a lower 2-port memory structure 405A, an upper 2-port memory structure 405B, and a difference 2-port memory structure 410. Each of the 2-port memory structures 405A, 405B and 410 may be constructed in a manner similar to the 2-port memory structure 300 illustrated in FIG. 3 (e.g., being constructed from three 1-port memory structures).

For purpose of discussion, the data entries stored by the table implemented on the 4-port memory structure 400 are divided into data subsets "A", "B", "C", and "D", each corresponding to a quarter of the total data entries of the 4-port structure 400.

The first 2-port memory structure 405A comprises three 1-port memory structures comprising a lower structure 415A storing a table containing the data subset "A", an upper structure 415B storing a table containing the data subset "B", and a difference structure 415C storing a table indicating differences between data subsets "A" and "B" (e.g., "A⊕B"). Similarly, the second 2-port memory structure 405B comprises a lower structure 420A storing a table containing the data subset "C", an upper structure 420B storing a table containing the data subset "D", and a difference memory 420C storing a table indicating differences between data subsets "C" and "D" (e.g., "C⊕D"). As such, the first 2-port memory structure 405A and the second 2-port memory structure 405B may function as a 2-port lower structure and a 2-port upper structure for the 4-port memory structure 400. The third 2-port memory structure 410 functions as a 2-port difference structure between the first and second 2-port memory structures 405A and 405B, comprising a lower structure 425A storing a table indicating differences between data subsets "A" and "C" (e.g., "A⊕C"), an upper structure 425B storing a table indicating differences between data subsets "B" and "D" (e.g., "B⊕C"), and a difference structure 425C storing a table indicating differences between all four data subsets (e.g., "(A⊕C)⊕(B⊕D)"). As illustrated in FIG. 4, the differences between data subsets may be determined using an XOR operation.

Each of the 2-port memory structures 405A, 405B, and 410 also comprises a respective access circuit 430, hereinafter referred to as sub-access circuits 430 (e.g., sub-access circuits 430A, 430B, and 430C), which may be substantially similar in structure to the access circuit 315 illustrated in FIG. 3.

Each port of each of the three sub-access circuits 430 connects to an access circuit 435. For example, the first access circuit 435A connects to the lower read port of each sub-access circuit 430, while the second access circuit 435B connects to the upper read port of each sub-access circuit 430. Each access circuit 435A may have a structure substantially similar to the access circuit 315 of FIG. 3. As each access circuit 435 has two read ports, the 4-port memory structure 400 has a total of four read ports 440A, 440B, 440C, and 440D, each able to access any of the data subsets "A", "B", "C", and "D" in parallel.

As illustrated in FIG. 4, the 4-port memory structure 400 for providing access to n data entries can be constructed using nine (or $3^2$) 1-port memory structures, each storing a table containing n/4 data entries, or as three 2-port memory structures, each storing tables containing a total of (3n/4) data entries. Consequently, the 4-port memory structure 400 stores tables containing a total of 9n/4 data entries. In general, using the above-discussed construction scheme, a memory structure configured to have $2^m$ ports for providing parallel access to n data entries can be constructed using upper, lower, and difference sub-structures storing a total of $(3/2)^m*n$ entries. In contrast, simply duplicating a 1-port memory structure in order to provide additional ports would require storage of $2^m*n$ entries for $2^m$ ports.

Figure 5:
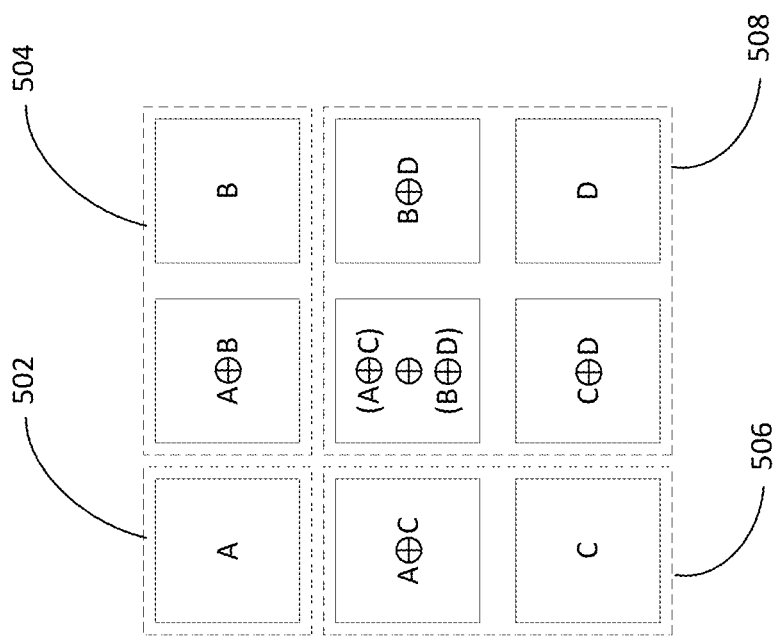
FIG. 5 illustrates a diagram of how the ports of the 4-port structure are able to access any data entry of the structure in parallel.

FIG. 5 illustrates a diagram of how the ports of the 4-port memory structure are able to access any data entry stored by the structure in parallel. As discussed above, the data entries stored by the 4-port memory structure may be divided into four data subset quarters: "A", "B", "C", and "D," each of which may be stored as a table on a single 1-port memory structure. In addition, the 4-port structure contains five additional 1-port structures storing tables indicating differences between one or more pairs of the data subsets (e.g., four structures storing differences between one pair of data subsets, and one structure storing differences of both pairs of data subsets). As such, the 4-port memory structure is assembled using nine 1-port memory structures (e.g., grouped into three 2-port memory structures, as illustrated in FIG. 4).

Using the construction described above, a read port of a 4-port memory structure is able to access a particular data entry (e.g., a data entry of the data subset "A") using one of four different methods, allowing for all four read ports of the memory structure to access the data entry in parallel. Using the first method 502, a read port may access the data subset "A" through the 1-port memory structure storing the table containing the data subset "A" (e.g., structure 415A illustrated in FIG. 4). On the other hand, the remaining methods 504, 506, and 508 require reconstruction of the data subset "A" by accessing a plurality of other memory structures. For example, the read port may use the second method 504 to access the memory structures storing tables containing data subset "B" (structure 415B) and the difference between data subsets "A" and "B" (structure 415C), in order to determine entries of the data subset "A." Alternatively, using the third method 506, the port can access the memory structures storing tables containing the data subset "C" (structure 420A) and the difference between "A" and "C" (structure 425A), to determine entries of the data subset "A." Using the fourth method 508, the port accesses the memory structures storing tables containing the data subset "D" (structure 420B), the difference between "C" and "D" (structure 420C), the difference between "B" and "D" (structure 425B), and the difference between all four data subsets (structure 425C), to determine entries of the data subset "A." Each of the remaining data subsets "B", "C", and "D" can also each be determined using one of four different methods in a similar fashion. Therefore, any data from any of the data subsets can be accessed or determined at each of the four read ports in parallel.

Figure 6:
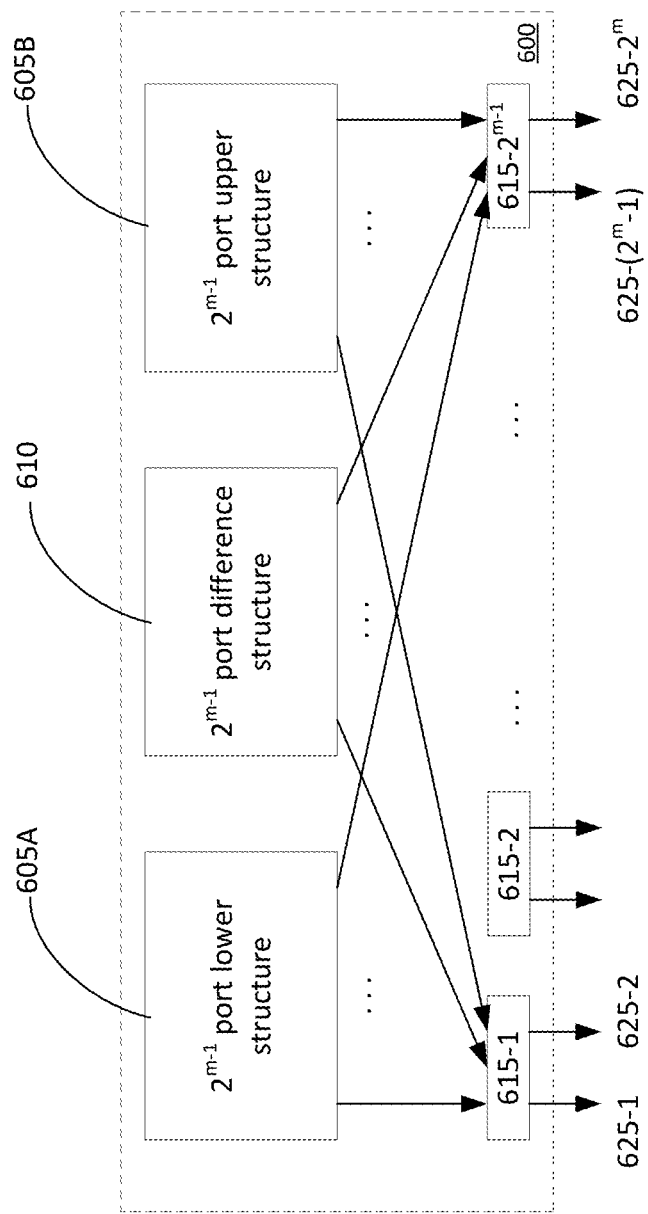
FIG. 6 illustrates a structure having $2^m$ read ports constructed from three $2^{m-1}$-port structures, in accordance with some embodiments.

The techniques and construction described above can be further extrapolated to construct memory structures having $2^m$ read ports. FIG. 6 illustrates a memory structure having $2^m$ read ports constructed from three $2^{m-1}$-port memory structures, in accordance with some embodiments. Each $2^m$-port memory structure for providing access to n data entries is constructed using three $2^{m-1}$-port memory structures, comprising a lower structure 605A, an upper structure 605B, and a difference structure 610. Each of the $2^{m-1}$-port memory structures provides access to n/2 data entries. For example, the lower half of the n data entries are stored in the lower structure 605A, the upper half of the n data entries are stored in the upper structure 605B, and the difference structure 610 stores the differences between corresponding lower half and upper half entries.

Each of the $2^{m-1}$ ports of the $2^{m-1}$-port memory structures maps to an access circuit 615 (e.g., access circuits 615-1 through 615-$2^{m-1}$). For example, a first port of each of the three $2^{m-1}$-port memory structures maps to a first access circuit 615-1, a second port of each of the three $2^{m-1}$-port memory structures maps to a second access circuit 615-2, and so forth up to the access circuit 615-$2^{m-1}$.

Each access circuit 615 contains two read ports 625 (e.g., a lower read port and an upper read port 625-1 and 625-2 . . . 625)-$2^{m-1}$–1) and 625-$2^m$), each able to access either the $2^{m-1}$-port lower and upper structures 605A/B directly, or determine the value of data entries of the lower or upper structure using the difference structure 610 and the opposite structure. For example, each access circuit may be configured such that their respective lower read port is always able to access the lower sub-table 605A directly but uses the lower sub-table 605A and the difference sub-table 610 to determine values of entries in the upper sub-table 605B when the respective upper read port needs to concurrently access the upper sub-table 605B. Similarly, the upper read port is always able to access the upper sub-table 605B, but uses the upper sub-table 605B and the difference sub-table 610 to determine values of entries in the lower sub-table 605A when the lower read port is to concurrently access the lower sub-table 605A.

Thus, as illustrated in FIG. 6, the $2^m$-port memory structure will comprise $2^{m-1}$ access circuits mapped to each of the three $2^{m-1}$-port memory structures. As each access circuit 615 contains 2 ports, a total of $2^m$ ports are available. This allows for the $2^m$-port structure to be constructed using $(3/2)^m*n$ entries.

Although the techniques described herein primarily discuss constructing memory structures having multiple read ports using 1-port memory structures, it is understood that in other embodiments, memory structures having more than one read port (e.g., 2 read ports, 3 read ports, etc.) may be used to construct memory structures having additional read ports. For example, three memory structures each having k read ports can be used to construct a memory structure having up to 2 k read ports using the configuration described above.

In addition, constructed memory structures are not necessarily limited to $2^m$ ports. For example, if a particular level of the memory structure contains a number of ports that is not a power of two, a subsequent level may also have a number of ports that is not a power of 2 (e.g., three 3-port memory structures can be used to construct a 6-port memory structure). In addition, fewer access circuits may be used at a given level, reducing the total number of available read ports. For example, referring to FIG. 6, less than (m−1) access circuits 615 may be used, such that not every port of each $2^{m-1}$-port sub-structure maps to an access circuit 615, resulting in less than $2^m$ total read ports.

Although the above examples illustrate each level of a multiple read port memory structure constructed using two sub-structures storing subsets of data (e.g., lower and upper halves) and a difference sub-structure, it is understood that in other embodiments, different numbers of sub-structures may be used. For example, in some embodiments, the data entries may be divided between three sub-structures and a difference sub-structure. Instead of the difference corresponding to an XOR operation, a different operation (such as addition mod 3) may be used. In some embodiments, an access circuit may be configured to connect and control access to a plurality of the sub-structures to more than two ports.

Writing Data

A multiple read port memory structure (e.g., the $2^m$-port memory structure 600 described in FIG. 6) constructed from a plurality of component memory structures (e.g., the 1-port memory structure 200 described in FIG. 2) may be considered to comprise a plurality of levels. For example, a $2^m$-port memory structure constructed from a plurality of 1-port memory structures may comprise m levels, each level comprising $3^k$ memory structures each having $2^{m-k}$ read ports, where k indicates a level and corresponds to an integer between 1 and m. For example, referring to the 4-port memory structure 400 illustrated in FIG. 4, the memory structure 400 has a k=1 level containing three 2-port memory structures, and a k=2 level containing 9 1-port memory structures.

When writing data into a $2^m$-port memory structure, a recursive writing process is used such that the data to be written is reflected in all levels of the structure. For example, referring to the configuration illustrated in FIG. 4, in order to write new data into a particular data subset (e.g., data subset "B"), the data needs to be written to the 2-port lower structure 405A and the difference structure 410. Within the 2-port lower structure 405A, the data is written to the upper structure 415B (containing the table storing the data subset "B"). In addition, the data of the difference structure 415C (storing (A⊕B)) is also recalculated. In addition, within the 2-port difference structure 410, data within the upper structure 425B (storing (B⊕D)) and the difference structure 425C (storing (A⊕C)⊕(B⊕D)) also needs to be recalculated.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A memory configured to allow for concurrent read requests for data from each of a plurality of output read ports, comprising:
   first, second, and third memory sub-structures each storing respective subsets of data corresponding to a first subset, a second subset, and a difference subset generated from the first and second subsets, respectively, and each having respective first and second read ports through which common data of the respective subsets of data stored by the sub-structure can be read concurrently in parallel;
   a first access circuit connected to the first read ports of each of the first, second, and third memory sub-structures, and
   a second access circuit connected to the second read ports of each of the first, second, and third memory sub-structures,
   wherein each of the first and second access circuits comprise respective first and second output read ports, and are configured to satisfy concurrent read requests for data of the subsets of data stored on the first memory sub-structure from both the first and second output read ports, by passing data from the first memory sub-structure to the first output read port and concurrently passing data reconstructed using data from the second and third memory sub-structures to the second output read port.

2. The memory of claim 1, wherein each of the first and second access circuits are further configured to satisfy concurrent read requests for data of the subsets of data stored on the second memory sub-structure from both the first and second output read ports by passing data from the second memory sub-structure to the second output read port and concurrently passing data reconstructed using data from the first and third memory sub-structures to the first output read port.

3. The memory of claim 2, wherein each of the first, second, and third memory sub-structures comprises a first, a second, and a third single-port memory.

4. The memory of claim 3, wherein:
   the first single-port memory of the first memory sub-structure stores a first portion of the first subset of data;
   the second single-port memory of the first memory sub-structure stores a remaining portion of the first subset of data; and the third single-port memory of the first memory sub-structure stores difference data generated based upon the first portion and the remaining portion of the first subset of data.

5. The memory of claim 1, wherein the first access circuit comprises:
   a first difference calculation circuit configured to reconstruct data of the second subset of data using corresponding portions of the second subset of data stored in the second memory sub-structure and the difference data stored in the third memory sub-structure, and to provide the reconstructed data of the second subset of data to the first output read port of the first access circuit; and
   a second difference calculation circuit configured to reconstruct data of the first subset of data using corresponding portions of the second subset of data stored in the second memory sub-structure and the difference data stored in the third memory sub-structure, and to provide the reconstructed data of the first subset of data to the second output read port of the first access circuit.

6. The memory of claim 5, wherein the first access circuit is further configured to:
   in response to both the first and second output read ports of the first access circuit receiving read requests to read data of the first subset of data during a same time period, provide data from the first memory sub-structure to satisfy the read request from the first output read port, and reconstruct, using the second difference circuit connected to the second output read port, data of the first subset of data to satisfy the read request from the second output read port; and
   in response to the second output read port of the first access circuit receiving a read request to read data of the first subset of data without a concurrent read request to read data of the first subset of data from the first output read port of the first access circuit, provide data from the first memory sub-structure to satisfy the read request form the second output read port.

7. The memory of claim 1, wherein the first and second subsets of data are associated with a function, and wherein the first and second output read ports of the first and second access circuits are configured to receive a plurality of read requests in parallel as part of a single instruction multiple data (SIMD) application.

8. The memory of claim 1, wherein the plurality of read requests are received from a plurality of arithmetic logic units (ALUs), each ALU implementing a mathematical function by sending, via a corresponding read port of the first and second output read ports of the first and second access circuits, read requests for data of the first subset of data or the second subset of data.

9. The memory of claim 1, wherein the difference data comprises XOR values between corresponding portions of the first subset of data and the second subset of data.

10. The memory of claim 1, wherein the difference data comprises a first subset of difference data, a second subset of difference data, and additional difference data generated based upon the first subset of different data and the second subset of difference data.

11. A memory structure, comprising:
    a first memory substructure storing at least first data;
    a second memory substructure that provides at least reconstructed data of the first data;
    a first multiplexor having inputs connected to the first memory substructure and the second memory substructure, and an output connected to a first port;
    a second multiplexor having inputs connected to the first memory substructure and the second memory substructure, and an output connected to a second port; and
    a conflict control circuit to:
       configure the first multiplexor to provide data of the first data to the first port, responsive to a read request to read data of the first data through the first port, regardless of whether there is a concurrent read request to read data of the first data through the second port;
       configure the second multiplexor to:
          provide reconstructed data of the first data to the second port, responsive to concurrent read requests to read data of the first data through the first port and through the second port, and
          provide data of the first data to the second port responsive to a read request to read data of the first data through the second port if there is no concurrent read request to read data of the first data through the first port.

12. The memory structure of claim 11, wherein the second memory substructure stores at least second data and difference data generated based upon the first data and the second data, wherein the provided reconstructed data of the first data is reconstructed from corresponding portions of the second data and the difference data.

13. The memory structure of claim 12, wherein the second memory substructure comprises a difference circuit to generate reconstructed data of the first data from corresponding portions of the second data and the difference data.

14. The memory structure of claim 12, wherein:
    the first multiplexor further has an input configured to receive reconstructed data of the second data; and
    wherein the conflict control circuit further configures the first multiplexor to provide data of the reconstructed data of the second data to the first port, and the second multiplexor to provide data of the second data to the second port, responsive to concurrent read requests to read data of the second data through the first and second ports.

15. The memory structure of claim 14, wherein the reconstructed data of the second data is generated by a difference circuit connected to the first memory substructure and the second memory substructure, wherein the difference circuit generates the reconstructed data of the second data from corresponding portions of the first data accessed from the first memory substructure and the difference data accessed from the second memory substructure.

16. The memory structure of claim 14, wherein the conflict control circuit further configures the first multiplexor to provide data of the second data to the first port, if there is no concurrent read request to read data of the second data through the second port.

17. The memory structure of claim 12, wherein inputs of the second multiplexor connected to the second memory substructure comprise a first input configured to receive reconstructed data of the first data from the second memory substructure, and a second input configured to receive data of the second data from the second memory substructure.

18. The memory structure of claim 12, wherein the difference data comprises XOR values between corresponding portions of the first data and the second data.

19. The memory structure of claim 12, wherein the difference data comprises a first subset and a second subset of difference data generated from corresponding portions of the first data and the second data, and additional difference data generated based upon corresponding portions of the first and second subsets of difference data.

\* \* \* \* \*